US012775771B2

(12) United States Patent
Kim et al.

(10) Patent No.: US 12,775,771 B2

(45) Date of Patent: Oct. 27, 2026

(54) INTEGRATED CIRCUIT INCLUDING STANDARD CELLS, A METHOD OF DESIGNING A LAYOUT INCLUDING THE SAME, AND A COMPUTING SYSTEM THEREFOR

(71) Applicant: SAMSUNG ELECTRONICS CO., LTD., Suwon-si (KR)

(72) Inventors: Jong Woo Kim, Osan-si (KR); Seung Man Lim, Siheung-si (KR); Eun-Hee Choi, Seoul (KR); Min su Kim, Hwaseong-si (KR); Sang Jin Cheong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1083 days.

(21) Appl. No.: 17/841,747

(22) Filed: Jun. 16, 2022

(65) Prior Publication Data

US 2023/0083727 A1 Mar. 16, 2023

(30) Foreign Application Priority Data

Sep. 15, 2021 (KR) ........................ 10-2021-0123200
Jan. 14, 2022 (KR) ........................ 10-2022-0005745

(51) Int. Cl.

*G06F 30/392* (2020.01)
*G06F 30/394* (2020.01)
*G06F 30/3953* (2020.01)

(52) U.S. Cl.

CPC .......... *G06F 30/392* (2020.01); *G06F 30/394* (2020.01); *G06F 30/3953* (2020.01)

(58) Field of Classification Search

CPC ..................................................... G06F 30/392
USPC .......................................................... 716/119
See application file for complete search history.

(56) References Cited

U.S. PATENT DOCUMENTS 8,381,162 B2 2/2013 Pelloie
9,483,600 B2 11/2016 Bansal et al.
9,978,682 B1 5/2018 Correale, Jr. et al.
10,262,982 B2 4/2019 Hsu et al.
10,283,526 B2 5/2019 Zhu et al.
11,120,190 B2 9/2021 Schultz
(Continued)

FOREIGN PATENT DOCUMENTS

KR 10-2018-0114812 10/2018
KR 10-2157355 9/2020

*Primary Examiner* — Eric D Lee

(74) *Attorney, Agent, or Firm* — MORGAN, LEWIS & BOCKIUS LLP

(57) ABSTRACT

An integrated circuit including: a first cell including first-a and second-a output pins, a first routing wire connecting the first-a output pin to the second-a output pin, a first-a via connecting the first-a output pin to the first routing wire, and a second-a via connecting the second-a output pin to the first routing wire; and a second cell including first-b and second-b output pins, a second routing wire connecting the first-b output pin to the second-b output pin, a first-b via connecting the first-b output pin to the second routing wire, and a second-b via connecting the second-b output pin to the second routing wire, wherein the first-a via is at a first-a position, the second-a via is at a second-a position, the first-b via is at a first-b position, the second-b via is at a second-b position different from each other.

4 Claims, 9 Drawing Sheets

(56) References Cited

U.S. PATENT DOCUMENTS

| | | | | |
|---|---|---|---|---|
| 2019/0103356 | A1 | 4/2019 | Zohrabyan et al. | |
| 2019/0163863 | A1* | 5/2019 | Yang | G06F 30/396 |

* cited by examiner

INTEGRATED CIRCUIT INCLUDING STANDARD CELLS, A METHOD OF DESIGNING A LAYOUT INCLUDING THE SAME, AND A COMPUTING SYSTEM THEREFOR

CROSS-REFERENCE TO RELATED APPLICATIONS

This application claims priority 35 U.S.C. § 119 to Korean Patent Application No. 10-2021-0123200 filed on Sep. 15, 2021 and Korean Patent Application No. 10-2022-0005745 filed on Jan. 14, 2022 in the Korean Intellectual Property Office, the disclosures of which are incorporated by reference herein in their entireties.

1. TECHNICAL FIELD

The present disclosure relates to an integrated circuit including standard cells, a method of designing a layout including the same, and a computing system therefor.

2. DESCRIPTION OF THE RELATED ART

As configurations for integrated circuits become increasingly complex and semiconductor fabrication processes are extensively refined, numerous semiconductor devices can be integrated in an integrated circuit. In addition, gate lengths of the semiconductor devices manufactured in the integrated circuit, as well as the width of wiring lines connecting the semiconductor devices, continue to decrease. As cross-sectional areas of wiring lines decrease, electro-migration (EM) may occur. Due to the EM, wiring lines may be open (e.g., there may be gaps in individual wiring lines), or different wiring lines may be short-circuited with one another.

SUMMARY

Embodiments of the present disclosure provide an integrated circuit including standard cells with improved wiring efficiency and reduced electro-migration (EM) by conducting routing wiring, which connects output pins, in a higher-level process than a cell design process.

Embodiments of the present disclosure also provide a method of manufacturing an integrated circuit including standard cells with improved wiring efficiency and reduced EM by conducting routing wiring, which connects output pins, in a higher-level process than a cell design process.

Embodiments of the present disclosure also provide a computing system for manufacturing a standard cell with improved wiring efficiency and reduced electro-migration (EM) by conducting routing wiring, which connects output pins, in a higher-level process than a cell design process.

According to an embodiment of the present disclosure, there is provided an integrated circuit including: a first standard cell including a first-a output pin and a second-a output pin, a first routing wire configured to electrically connect the first-a output pin to the second-a output pin, a first-a via configured to electrically connect the first-a output pin to the first routing wire, and a second-a via configured to electrically connect the second-a output pin to the first routing wire, wherein each of the first-a output pin and the second-a output pin are configured to output a first signal; and a second standard cell including a first-b output pin and a second-b output pin, a second routing wire configured to electrically connect the first-b output pin to the second-b output pin, a first-b via configured to electrically connect the first-b output pin to the second routing wire, and a second-b via configured to electrically connect the second-b output pin to the second routing wire, wherein each of the first-b output pin and the second-b output pin are configured to output a second signal, wherein the first-a via is placed at a first-a position in the standard cell, the second-a via is placed at a second-a position in the standard cell, the first-b via is placed at a first-b position in the standard cell, the second-b via is placed at a second-b position in the standard cell, and the first-a position, the second-a position, the first-b position, and the second-b position are different from one another.

According to an embodiment of the present disclosure, there is provided a computing system, wherein the computing system is configured to: manufacture a first standard cell including a plurality of logical elements configured to receive a first input and output a first signal, by: performing a high level design step in which transistors constituting the plurality of logical elements are logically designed using a semiconductor design tool; and a layout design step for the logically designed transistors, wherein a plurality of first output pins connected, respectively, to the plurality of logical elements and configured to output the first signal and a first routing wire connecting the first output pins are placed by a placement and routing operation in the layout design step, so that the number of pins configured to output the first signal is one.

According to an embodiment of the present disclosure, there is provided a method of designing a layout for manufacturing a first standard cell including a plurality of logical elements configured to receive a first input and output a first signal, the method including: placing transistors constituting the plurality of logical elements; and placing a wire configured to transfer an electrical signal to each terminal of the transistors, wherein the placing of the wire includes: first placing a first wire along a first wiring layer extending in a first direction, second placing a second wire along a second wiring layer extending in a second direction that intersects the first direction, third placing a third wire along a third wiring layer extending in the first direction, wherein a first routing wire connecting first output pins configured to output the first signal is placed along the first wiring layer, is placed along the second wiring layer, and then is placed along the third wiring layer.

BRIEF DESCRIPTION OF THE DRAWINGS

The above and other features of the present disclosure will become more apparent by describing in detail embodiments thereof with reference to the attached drawings, in which.

DETAILED DESCRIPTION OF THE EMBODIMENTS

Hereinafter, embodiments of the present disclosure will be described with reference to the attached drawings.

Figure 1:
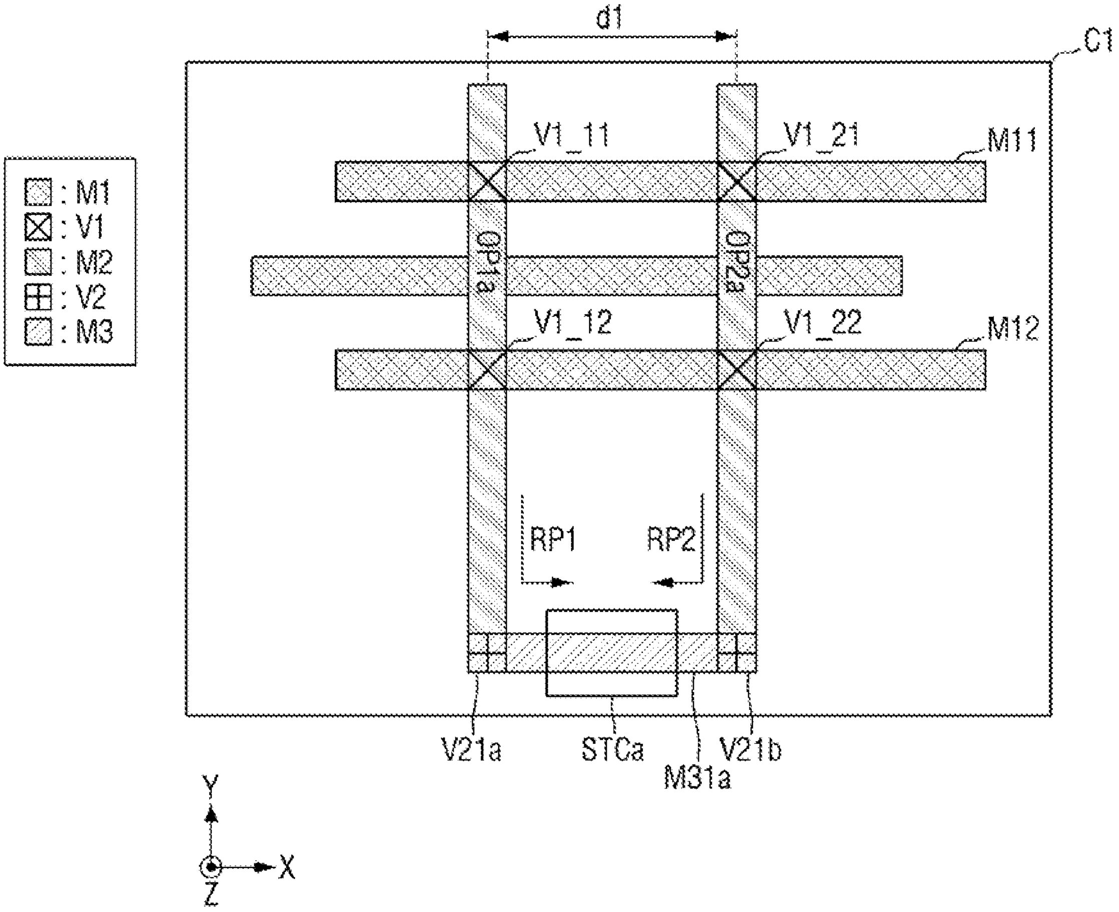
FIGS. 1, 2 and 3 are diagrams illustrating an example layout for describing a standard cell according to some embodiments of the present disclosure.
Figure 2:
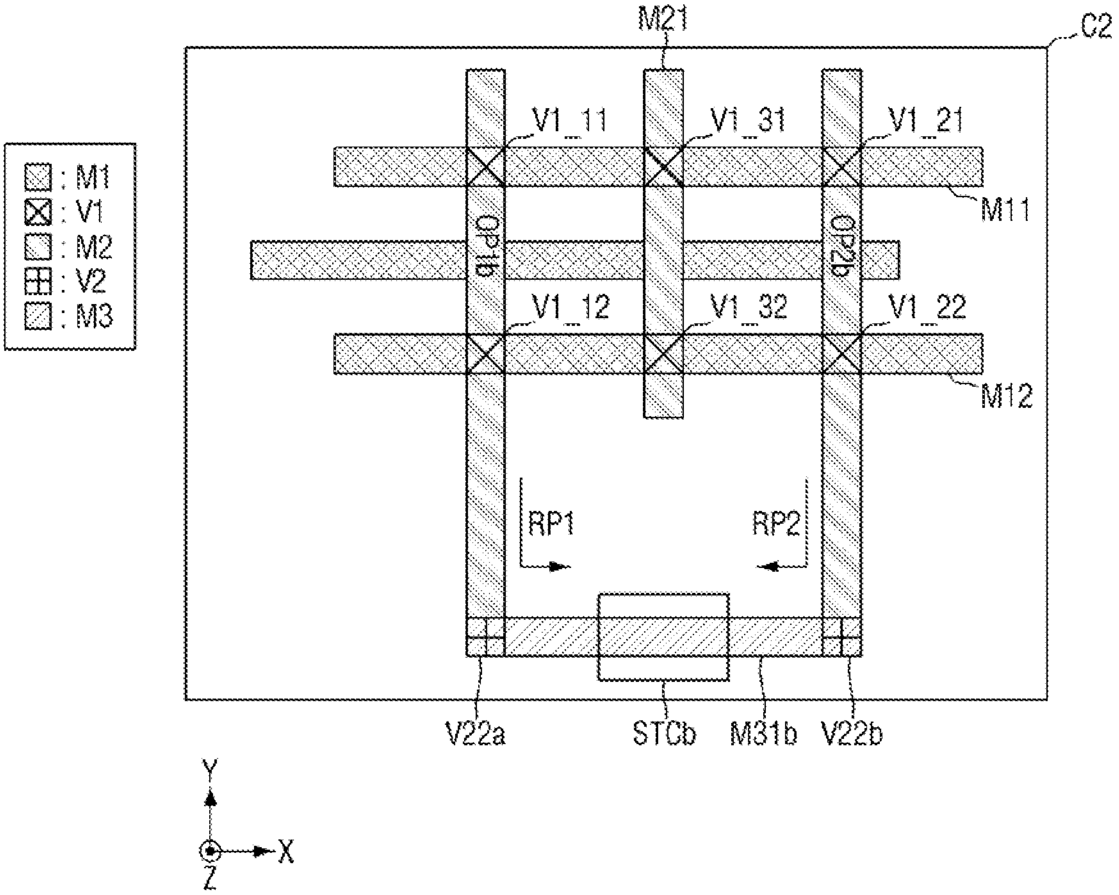
Figure 3:
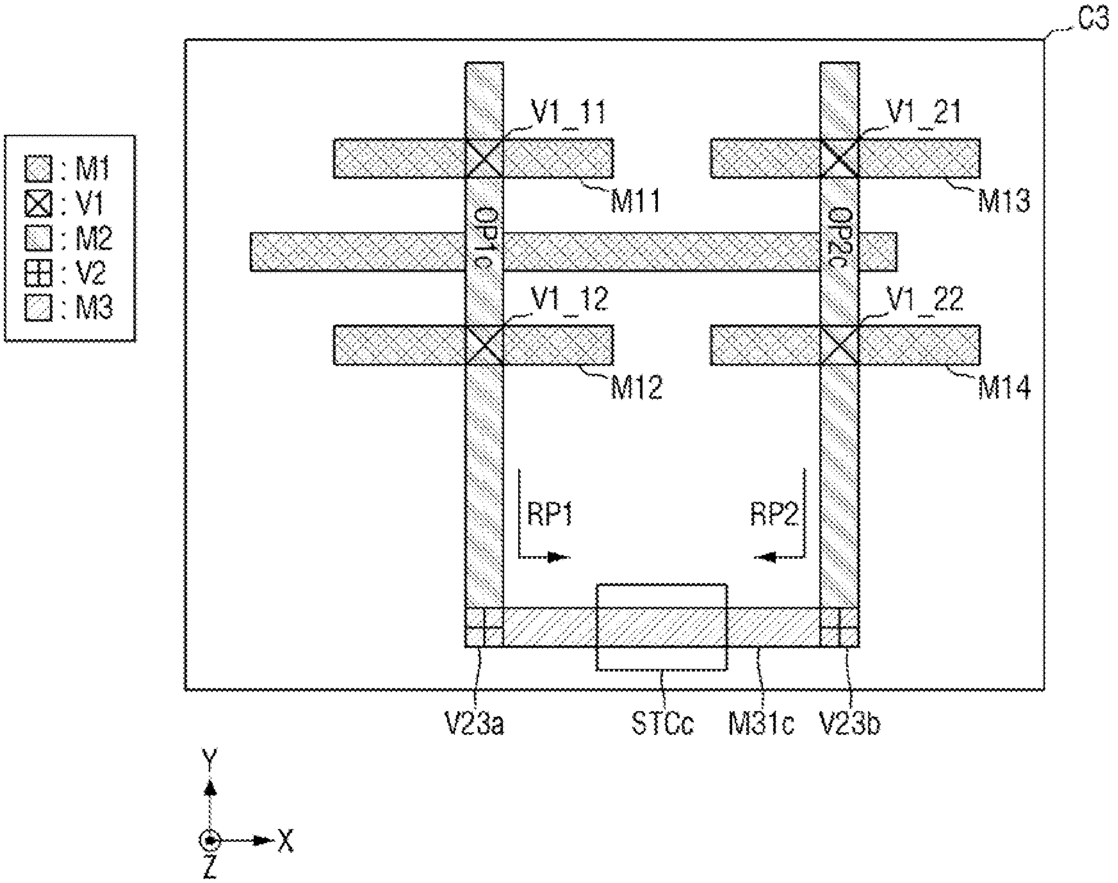

FIGS. 1 to 3 are diagrams illustrating an example layout for describing a standard cell according to some embodiments of the present disclosure.

A standard cell may be a unit of a layout included in an integrated circuit and may be referred to as a cell. An integrated circuit may include a plurality of various standard cells. The standard cells may have a structure that conforms to a predetermined standard and may be aligned and disposed in a plurality of rows. Herein, a first direction X may be referred to as a first horizontal direction, a second direction Y may be referred to as a second horizontal direction, and a plane based on the first direction X and the second direction Y may be referred to as a horizontal plane.

Referring to FIG. 1, a standard cell C1 according to some embodiments of the present disclosure may be at least one cell defined by a cell boundary. The standard cell C1 may be provided from a standard cell library.

The standard cell C1 may include an active region extending in the first direction X and may include a gate line extending in the second direction Y. The gate line and the active region may form a transistor. The standard cell C1 may include at least one fin extending in the first direction X in the active region, and the fin may form a fin field effect transistor (FinFET) along with the gate line. The transistor formed in the gate line and the active region is not limited thereto, and may include, for example, a multi-bridge channel field effect transistor (MBCFET) including a plurality of nanowires. The active region and the gate line may be electrically connected to a pattern of a conductive layer (for example, a first wiring layer M1) through a contact and/or a via.

The active region may include a semiconductor such as, for example, silicon (Si) or germanium (Ge), or a compound semiconductor such as, for example, silicon-germanium (SiGe), silicon carbide (SiC), gallium arsenide (GaAs), indium arsenide (InAs), or indium phosphide (InP), and the conductive region (e.g., the conductive layer) may include, for example, an impurity-doped well and an impurity-doped structure. In an embodiment of the present disclosure, the gate line may include a work function metal-containing layer and a gap-fill metal layer. For example, the work function metal-containing layer may include at least one metal of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap-fill metal layer may include a tungsten (W) layer or an aluminum (Al) layer. In an embodiment of the present disclosure, gate lines may include a stacked structure of TiAlC/TiN/W, a stacked structure of TiN/TaN/TiAlC/TiN/W, or a stacked structure of TiN/TaN/TiN/TiAlC/TiN/W.

The standard cell C1 may include a plurality of wiring layers (for example, a first wiring layer M1, a second wiring layer M2, and a third wiring layer M3), which are stacked in a third direction Z. The third direction Z may be a thickness direction of semiconductor substrate. In an embodiment of the present disclosure, a width of a pattern provided in the third wiring layer M3 may be greater than that of a pattern provided in the second wiring layer M2, and a width of a pattern provided in the second wiring layer M2 may be greater than that of a pattern provided in the first wiring layer M1. However, the present disclosure is not limited thereto. For example, a width of a pattern provided in the first wiring layer M1 may be greater than a width of a pattern provided in the second wiring layer M2 or the third wiring layer M3.

In an embodiment of the present disclosure, patterns provided in the first wiring layer M1 may extend in the first direction X, patterns provided in the second wiring layer M2 may extend in the second direction Y, and patterns provided in the third wiring layer M3 may extend in the first direction X. However, the standard cell C1 is not limited thereto, and a direction in which each pattern extends may be variously set. For example, pattern provided in the second wiring layer M2 may extend in the first direction X.

The patterns provided in each of the first wiring layer M1, the second wiring layer M2, and the third wiring layer M3 may include metal, conductive metal nitride, metal silicide, or a combination thereof. For example, the patterns provided in each of the first wiring layer M1, the second wiring layer M2, and the third wiring layer M3 may include a conductive material such as W, Mo, Ti, Co, tantalum (Ta), Ni, tungsten silicide, titanium silicide, cobalt silicide, tantalum silicide, or nickel silicide.

The standard cell C1 may include the patterns provided in the first wiring layer M1 and the patterns provided in the second wiring layer M2, and may include a first via V1 which is provided between the first wiring layer M1 and the second wiring layer M2 and which connects the first wiring layer M1 to the second wiring layer M2. However, the present disclosure is not limited thereto. For example, the standard cell C1 may further include the patterns provided in the third wiring layer M3 and may include a second via V2 which is provided between the second wiring layer M2 and the third wiring layer M3 and which connects the second wiring layer M2 to the third wiring layer M3. Patterns illustrated in FIG. 1 may be some of the patterns included in the standard cell C1.

In an embodiment of the present disclosure, the first standard cell C1 may include a first output pin OP1*a* and a second output pin OP2*a*. The first output pin OP1*a* and the second output pin OP2*a* may be spaced apart from each other on the same horizontal plane, e.g., a plane on which the second wiring layer M2 is provided. The first output pin OP1*a* and the second output pin OP2*a* may be spaced apart from each other by a first distance d1 in the first direction X.

The first output pin OP1*a* and the second output pin OP2*a* may be electrically connected to each other in the first standard cell C1. For example, the first output pin OP1*a* and the second output pin OP2*a* may be connected to each other through patterns M11 and M12 provided in the first wiring layer M1 and first vias V1_11, V1_12, V1_21, and V1_22 provided between the first wiring layer M1 and a second wiring layer M2. In the layout shown in FIG. 1, the first output pin OP1*a*, the second output pin OP2*a*, and the patterns M11 and M12 provided in the first wiring layer M1 may form a ring shape.

In an embodiment of the present disclosure, the first output pin OP1*a* and the second output pin OP2*a* may be patterns of the second wiring layer M2. However, the standard cell C1 is not limited thereto, and the first output pin OP1*a* and the second output pin OP2*a* may be provided on a layer which is higher than the first wiring layer M1, and for example, may be formed as the patterns of the third wiring layer M3.

The first output pin OP1*a* may be connected to a first routing path RP1, and the second output pin OP2*a* may be connected to a second routing path RP2. A load cell (e.g., a cell group STCa) may be connected to a portion where the first routing path PR1 and the second routing path RP2 are connected.

The standard cell C1 may be a driving cell which drives the cell group STCa. The cell group STCa may include at least one load cell. In an embodiment of the present disclosure, the standard cell C1 may be a power cell which provides power to the cell group STCa. Alternatively, in an embodiment of the present disclosure, the standard cell C1 may be a clock gating cell which provides an internal clock signal to the cell group STCa.

The first output pin OP1*a* and the second output pin OP2*a* may be connected to an input pin of at least one load cell included in the cell group STCa. The cell group STCa may receive an output signal output from the first output pin OP1*a* and receive an output signal output from the second output pin OP2*a*. Output signals respectively output from the first and second output pins OP1*a* and OP2*a* are the same signals.

In an embodiment of the present disclosure, the first routing path RP1 may include the first output pin OP1*a* provided in the second wiring layer M2, a routing wire M31*a* provided on the third wiring layer M3, and a second via V21*a* connecting the second wiring layer M2 to the third wiring layer M3. In addition, the second routing path RP2 may include the second output pin OP2*a* provided in the second wiring layer M2, the routing wire M31*a* provided in the third wiring layer M3, and a second via V21*b* connecting the second wiring layer M2 to the third wiring layer M3. The cell group STCa may be disposed between the second vias V21*a* and V21*b*. However, unlike that shown in FIG. 1, the routing wires constituting the first routing path RP2 and the second routing path RP2 may be formed on a variety of wiring layers.

In other words, the first routing path RP1 and the second routing path RP2 that receive the same input and output the same output may be connected to each other through the routing wire M31*a*.

The standard cell C1 may include the routing wire M31*a* which connects the first and second output pins OP1*a* and OP2*a* configured to output the same signals. In this case, the routing wire M31*a* is not disposed in a process of forming the gate line and the active region that form a transistor. For example, the routing wire M31*a* is disposed in a separate process. In other words, the routing wire M31*a* may be placed by setting must-join pins of a placement and routing tool in a process of placement and routing (P&A) to be the first output pin OP1*a* and the second output pin OP2*a*.

Figure 5:
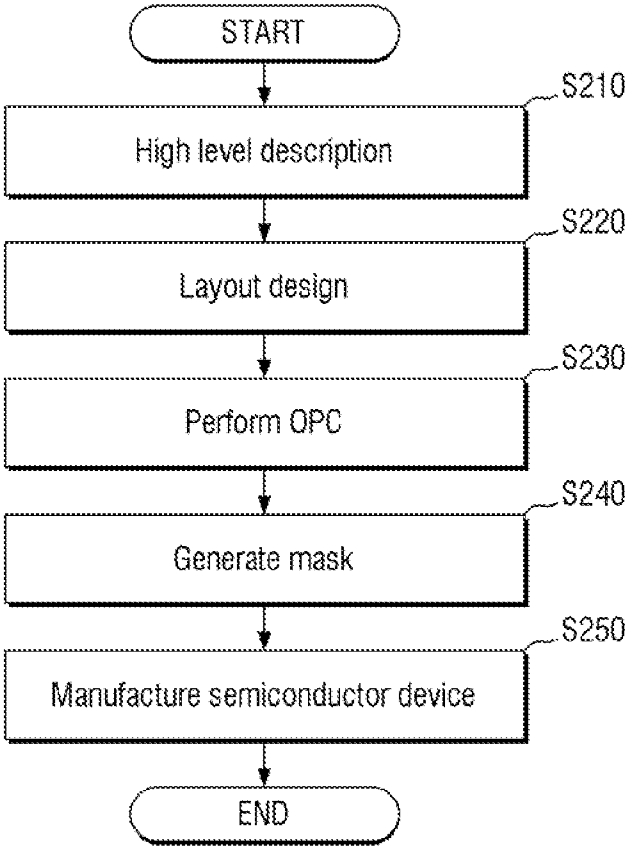
FIG. 5 is a flowchart for describing a computing system for manufacturing a standard cell according to some embodiments of the present disclosure.

In other words, the routing wire M31*a* is disposed in a placement and routing step S20 shown in FIG. 5, so that the routing wire M31*a* is precisely placed in the position of the third wiring layer M3, thereby increasing the wiring efficiency. In addition, depending on electro-migration (EM) that may be generated by the cell group STCa connected to the routing wire M31*a*, the position of the routing wire M31*a* may be adjusted, so that the influence of the EM on the standard cell C1 can be reduced. For example, an output load of the standard cell C1 may be reduced. Therefore, a current density of a current flowing through the first output pin OP1*a* and the second output pin OP2*a* may be reduced, and thus, the occurrence of EM may be prevented or reduced. In other words, in the standard cell C1 according to some embodiments of the present disclosure, the routing wire M31*a* is disposed in the placement and routing step S20 shown in FIG. 5, so that a defect in which wires are short-circuited with each other or are open in the integrated circuit including the standard cell C1 due to EM may be reduced.

Hereinafter, a description redundant to the embodiment described with reference to FIG. 1 will be omitted and differences will be mainly described.

Referring to FIG. 2, a standard cell C2 may include a first output pin OP1*b* and a second output pin OP2*b*.

The first output pin OP1*b* and the second output pin OP2*b* may be electrically connected to each other in the standard cell C2. For example, the first output pin OP1*b* and the second output pin OP2*b* may be connected to each other through patterns M11 and M12 provided in a first wiring layer M1, first vias V1_1, V1_12, V1_21, V1_22, V_31, and V1_32 provided between the first wiring layer M1 and a second wiring layer M2, and a pattern M21 provided in the second wiring layer M2. The pattern M21 provided in the second wiring layer M2 may be connected to the patterns M11 and M12 provided in the first wiring layer M1 through the first vias V1_31 and V1_32.

In the layout shown in FIG. 2, the first output pin OP1*b*, the second output pin OP2*b*, the patterns M11 and M12 provided in the first wiring layer M1, and the pattern M21 provided in the second wiring layer M2 may form a mesh structure.

The first output pin OP1*b* may be connected to a first routing path RP1, and the second output pin OP2*b* may be connected to a second routing path RP2. A cell group STCb may receive output signals output from the first output pin OP1*b* and the second output pin OP2*b*. Output signals respectively output from the first and second output pins OP1*b* and OP2*b* are the same signals.

The standard cell C2 may include a routing wire M31*b* which connects the first and second output pins OP1*a* and OP2*a* configured to output the same signals. In this case, the routing wire M31*b* is not disposed in the process of forming the gate line and the active region that form a transistor. In other words, the routing wire M31*b* is disposed in a process other than the process of forming the gate line and the active region that form a transistor. In other words, the routing wire M31*b* may be placed by setting must-join pins of a placement and routing tool in the placement and routing step S20 to be the first output pin OP1*b* and the second output pin OP2*b*.

In other words, the routing wire M31*b* is disposed in the placement and routing step S20 shown in FIG. 5, so that the routing wire M31*b* is precisely placed in the position of the third wiring layer M3, thereby increasing the wiring efficiency. In addition, depending on EM that may be generated by the cell group STCb connected to the routing wire M31*b*, the position of the routing wire M31*b* may be adjusted, so that the influence of the EM on the standard cell C2 can be reduced. For example, an output load of the standard cell C2 may be reduced. Therefore, a current density of a current flowing through the first output pin OP1*b* and the second output pin OP2*b* may be reduced, and thus, the occurrence of EM may be prevented or reduced. In addition, in the standard cell C2 according to some embodiments of the present disclosure, the routing wire M31*b* is disposed in the placement and routing step S20 shown in FIG. 5, so that a defect in which wires are short-circuited with each other or are open in the integrated circuit including the standard cell C2 due to EM may be reduced.

In FIG. 2, the routing wire M31*b* is connected to the first output pin OP1*b* through second via V22*a* and to the second output pin OP2*b* through second via V22*b*.

Referring to FIG. 3, the standard cell C3 may include the patterns provided in the first wiring layer M1 and the patterns provided in the second wiring layer M2. However, the present disclosure is not limited thereto and the standard cell C3 may further include patterns provided in a third wiring layer M3.

In an embodiment of the present disclosure, the standard cell C3 may include a first output pin OP1*c* and a second output pin OP2*c*. In FIGS. 1 and 2, the standard cells C1 and C2 are illustrated as each including two output pins, the first output pin OP1*a* and OP1*b* and the second output pin OP2*a* and OP2*b*. However, the present disclosure is not limited thereto. The number of output pins provided in the standard cell C3 may be three or more.

In an embodiment of the present disclosure, the first output pin OP1*c* and the second output pin OP2*c* of the standard cell C3 may be connected to different elements. For example, the first output pin OP1*c* may be connected to a first inverter, and the second output pin OP2*c* may be connected to a second inverter. The first inverter and the second inverter may receive one signal and may respectively output the same output signal to the first output pin OP1*c* and the second output pin OP2*c*.

The first output pin OP1*c* may be connected to a first routing path RP1, and the second output pin OP2*c* may be connected to a second routing path RP2. A cell group STCc may receive the same output signals output from the first output pin OP1*c* and the second output pin OP2*c*. In an embodiment of the present disclosure, the first output pin OP1*c* and the second output pin OP2*c* may be physically spaced apart from each other, and a first output signal and a second output signal respectively output from the first output pin OP1*c* and the second output pin OP2*c* are the same signals. However, one signal may be output from the first output pin OP1*c* and the second output pin OP2*c*, which branch out from one end of a buffer or an inverter and are connected to the other end of the buffer or the inverter, and thus, a timing characteristic of each of the first output signal and the second output signal may vary.

In an embodiment of the present disclosure, the first output pin OP1*c* and the second output pin OP2*c* may each be formed as a pattern of the second wiring layer M2 in the standard cell C3. The first output pin OP1*c* may be connected to the patterns M11 and M12 of the first wiring layer M1 through the first vias V1_11 and V1_12 provided between the first wiring layer M1 and the second wiring layer M2. The second output pin OP2*c* may be connected to the patterns M13 and M14 of the first wiring layer M1 through the first vias V1_21 and V1_22 provided between the first wiring layer M1 and the second wiring layer M2.

In an embodiment of the present disclosure, the first output pin OP1*c* and the second output pin OP2*c* may be spaced apart from each other on the same horizontal plane, e.g., a plane on which the second wiring layer M2 is provided. The patterns M11 and M12 of the first wiring layer M1, which are connected to the first output pin OP1*c* and are disposed under the first output pin OP1*c*, and the patterns M13 and M14 of the first wiring layer M1, which are connected to the second output pin OP2*c* and are disposed under the second output pin OP2*c*, may be spaced apart from each other on the same horizontal plane, e.g., a plane on which the first wiring layer M1 is provided. However, a characteristic of the first output signal output from the first output pin OP1*c* is the same as that of the second output signal output from the second output pin OP2*c*.

The standard cell C3 according to the present disclosure may include a routing wire M31*c* which connects the first and second output pins OP1*c* and OP2*c* configured to output the same signals. The outing wire M31*c* is connected to the first output pin OP1*c* through second via V23*a* and to the second output pin OP2*c* through second via V23*b*. In this case, the routing wire M31*c* is not disposed in the process of forming the gate line and the active region that form a transistor. In other words, the routing wire M31*c* may be placed by setting must-join pins of a placement and routing tool in the placement and routing step S20 to be the first output pin OP1*c* and the second output pin OP2*c*.

In other words, the routing wire M31*c* is disposed in the placement and routing step S20 shown in FIG. 5, so that the routing wire M31*c* is precisely placed in the position of the third wiring layer M3, thereby increasing the wiring efficiency. In addition, depending on EM that may be generated by a cell group STCc connected to the routing wire M31*c*, the position of the routing wire M31*c* may be adjusted, so that the influence of the EM on the standard cell C3 can be reduced. For example, an output load of the standard cell C3 may be reduced. Therefore, a current density of a current flowing through the first output pin OP1*c* and the second output pin OP2*c* may be reduced, and thus, the occurrence of EM may be prevented or reduced. In other words, in the standard cell C3 according to some embodiments of the present disclosure, the routing wire M31*c* is disposed in the placement and routing step S20 shown in FIG. 5, so that a defect in which wires are short-circuited with each other or are open in the integrated circuit including the standard cell C3 due to EM may be reduced.

Figure 4:
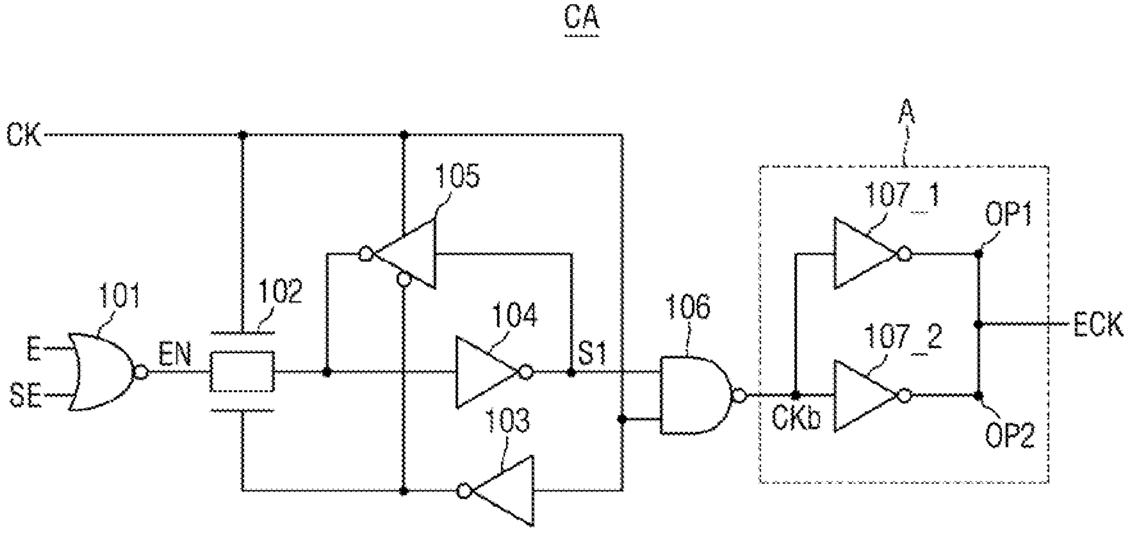
FIG. 4 is a circuit diagram for describing an example in which a standard cell is a clock gating cell according to some embodiments of the present disclosure.

FIG. 4 is a circuit diagram for describing an example in which a standard cell is a clock gating cell according to some embodiments of the present disclosure. Portion A shown in FIG. 4 may correspond to the layout of the standard cell C3 shown in FIG. 3.

In FIG. 4, a circuit of each of elements of the standard cell C3 corresponding to a clock gating cell CA is illustrated in detail. However, the present disclosure is not limited to the configuration illustrated in FIG. 4. A circuit of each of elements of the clock gating cell CA may be modified. In addition, although portion A of FIG. 4 is to illustrate the standard cell C3 of FIG. 3, it is noted that the following description is applicable to other driving cells (e.g., the standard cells C1 and C2) which drive a plurality of load cells.

Referring to FIG. 4, the clock gating cell CA may include a NOR gate 101, a transmission gate 102, inverters 103 and 104, a three-phase inverter 105, a NAND gate 106, a first output inverter 107_1 and a second output inverter 107_2.

The NOR gate 101 may receive an enable signal E and a scan enable signal SE, and may generate an inverted enable signal. The transmission gate 102, the inverter 104, and the three-phase inverter 105 may configure a latch. The transmission gate 102 may receive the inverted enable signal EN and may transfer the inverted enable signal EN to the inverter 104 on the basis of a clock signal CK. The inverter 104 may invert the inverted enable signal EN and may transfer a first signal S1 to the NAND gate 106. The three-phase inverter 105 may receive the first signal S1 and may output a signal generated by inverting the first signal S1 on the basis of the clock signal CK.

The NAND gate 106 may receive the first signal S1 and the clock signal CK, and may generate an inverted clock signal CKb.

The first output inverter 1071 may receive the inverted clock signal CKb from the NAND gate 106 and invert the inverted clock signal CKb to output a first output signal to a first output pin OP1.

The second output inverter 107_2 may receive the inverted clock signal CKb from the NAND gate 106 and invert the inverted clock signal CKb to output a second output signal to a first output pin OP2.

The first output signal and the second output signal are the same output signals.

The first output signal and the second output signal may be output (ECK) through a routing wire which connects an output terminal of the first output inverter 107_1 and an output terminal of the second output inverter 107_2.

FIG. 5 is a flowchart for describing a computing system for manufacturing a standard cell according to some embodiments of the present disclosure.

Referring to FIG. 5, a computing system for manufacturing a standard cell may be used in a method of manufacturing an integrated circuit (IC) including standard cells (e.g., the standard cells C1 to C3) according to some embodiments of the present disclosure. For example, the computing system for manufacturing a standard cell may be a process design kit.

In step S210, a high level design of a semiconductor IC including a standard cell according to some embodiments of the present disclosure may be conducted. The high level design may mean to describe a design target integrated circuit in a high-level computer language. For example, a semiconductor design tool (e.g., a logic synthesis tool) using a high-level language may use a hardware description language (HDL), such as very high-speed integrated circuit (VHSIC) hardware description language (VHDL), or a high-level language, such as C language. Circuits designed by a high-level design may be more specifically expressed by a register transfer level (RTL) coding or simulation. Furthermore, a code generated by the RTL coding may be converted into a netlist to be synthesized to the entire semiconductor device. The synthesized schematic circuit may be verified by a simulation tool and may be accompanied with an adjustment process depending on a verification result.

As described above with reference to FIGS. 1 to 4, the standard cell according to some embodiments of the present disclosure may include, for example, the routing wire M31*a* which connects the first and second output pins OP1*a* and OP2*a* configured to output the same signals (see FIG. 1). In this case, the routing wire M31*a* is not disposed in a process of forming the gate line and the active region that form a transistor.

In other words, in step S210, which is a high level design step, the number of pins configured to output the same signals may be set to two.

In step S220, a layout design may be performed to implement a logically completed semiconductor IC including the standard cell according to some embodiments of the present disclosure on a silicon substrate. For example, a layout design may be performed with reference to a schematic circuit synthesized in a high-level design, or a netlist corresponding thereto. The layout design may include a routing process which arranges and connects various standard cells provided from a cell library according to a prescribed design rule.

In other words, as described above with reference to FIGS. 1 to 4, in the standard cell according to some embodiments of the present disclosure, for example in FIG. 1, the routing wire M31*a*, which connects the first and second output pins OP1*a* and OP2*a* configured to output the same signals, may be placed by setting must-join pins of a placement and routing tool in a placement and routing (P&A) step to be the first output pin OP1*a* and the second output pin OP2*a* in step S220.

Therefore, in step S220, which is a layout design step, the number of pins outputting the same signals may be set to two through placement and routing.

The standard cell library may include a plurality of data defining a layout of a standard cell.

In an embodiment of the present disclosure, the standard cell library may define the layout of standard cells (e.g., C1 to C3 of FIGS. 1 to 3) that provide the same function and performance. For example, first data may define a standard cell including one output pin which outputs a specific output signal. Second, third, fourth, fifth and sixth data may define a standard cell including a plurality of output pins each of which outputs a specific output signal.

In an embodiment of the present disclosure, an EM criterion for each standard cell may be defined in the standard cell library. For example, the EM criterion may include a reference value of a load level based on load cells (e.g., the cell groups STCa to STCc of FIGS. 1 to 3) connected to an output pin of a standard cell which is a driving cell. In an embodiment of the present disclosure, the EM criterion may be received from a layout designer and may be stored in a memory, or may be a criterion defined in the layout design rule.

The cell library for the layout design may contain information on the operation, speed, power consumption, etc. of a standard cell. A cell library for representing a circuit of a specific gate-level as a layout may be defined in a layout design tool. The layout may be prepared to define or describe shapes and sizes of patterns constituting transistors and metal interconnection lines, which will be actually formed on a silicon substrate. For example, to form an inverter circuit on the substrate, layout patterns, such as a p-channel metal oxide semiconductor (PMOS) transistor, an n-channel metal oxide semiconductor (NMOS) transistor, an N-well, a gate electrode, and conductive lines to be placed thereon may be appropriately placed by a layout design tool. To accomplish this, an appropriate one(s) of inverters previously defined in a cell library may be searched for and selected.

Further, a routing step may be performed on the selected and placed standard cells. For example, the routing step may be performed on the selected and placed standard cells to connect them to upper wires. By the routing step, the standard cells may be electrically connected to each other to meet a design specification. These operations may be automatically or manually performed in the layout design tool.

For example, an operation of placing and routing the standard cells may be automatically performed by an additional placement and routing tool In some embodiments of the present disclosure, the computing system for manufacturing a standard cell may dispose, through the placement and routing step, the routing wires M31*a*, M31*b*, and M31*c* (see, e.g., FIGS. 1 to 3), which connect the vias V21*a* and V21*b*, V22*a* and V22*b*, and V23*a* and V23*b* (see, e.g., FIGS. 1 to 3) outputting the same signals, in the respective standard cells C1 to C3 (see, e.g., FIGS. 1 to 3).

In the standard cells according to embodiments of the present disclosure, the routing wires M31*a*, M31*b*, and M31*c* (see, e.g., FIGS. 1 to 3) which connect a plurality of output pins (e.g., OP1*a* and OP2*a* in FIG. 1, OP1*b* and OP2*b* in FIG. 2, and OP1*c* and OP2*c* in FIG. 3) outputting the same signals via the first and second routing paths RP1 and RP2 (see, e.g., FIGS. 1 to 3) may be placed by setting must-join pins of the placement and routing tool in the placement and routing step to be a plurality of output pins (e.g., the vias V21*a* and V21*b*, the vias V22*a* and V22*b*, and the vias V23*a* and V23*b* in FIGS. 1 to 3).

In other words, the routing wires are placed through the placement and routing process, thereby increasing the wiring efficiency. In addition, on the basis of EM that may be generated by the cell group connected to the routing wire, the location of the routing wire may be adjusted, so that the influence of the EM on the standard cells can be reduced. For example, an output load of the standard cells may be reduced. Therefore, a current density of a current flowing through a plurality of output pins may be reduced, and thus, the occurrence of EM may be prevented or reduced. In other words, in the standard cells according to some embodiments of the present disclosure, the routing wire that connects a plurality of output pins of the standard cells is placed through the placement and routing step, so that a defect in which wires are short-circuited with each other or are open in the integrated circuit including the standard cells due to EM may be reduced.

More specifically, for example, assuming that the computing system for manufacturing a standard cell is a process design kit, a plurality of output pins (e.g., OP1*a* and OP2*a* in FIG. 1. OP1*b* and OP2*b* in FIG. 2, and OP1*c* and OP2*c* in FIG. 3) configured to output the same signals (e.g., via the first and second routing paths RP1 and RP2 in FIGS. 1 to 3) may be set for each of the plurality of cells in a physical database library, such as Graphic Data Stream (GDS), GDSII, Library Exchange Format (LEF), and Milky way.

However, in some embodiments of the present disclosure, the computing system for manufacturing a standard cell disposes, through the placement and routing step, the routing wires M31*a*, M31*b*, and M31*c* (see, e.g., FIGS. 1 to 3), which connect the vias V21*a* and V21*b*, V22*a* and V22*b*, and V23*a* and V23*b* (see, e.g., FIGS. 1 to 3) outputting the same signals, in the respective standard cells C1 to C3 (see, e.g., FIGS. 1 to 3).

Therefore, for example, in the schematic circuit prepared in the high level design process, the netlist corresponding thereto, and a characterization DB (e.g., synopsys design kit or liberty design kit), one output pin (e.g., M31*a* in FIG. 1, M32*b* in FIG. 2, or M32*c* in FIG. 3) outputting the same signal (e.g., via the first and second routing paths RP1 and RP2 in FIGS. 1 to 3) may be set for each of the plurality of cells.

After the routing step, a verification operation may be performed on the layout to check whether there is a portion that violates the given design rule. The verification operation may include a design rule check (DRC), an electrical rule check (ERC), and a layout versus schematic (LVS). The DRC may be performed to evaluate whether the layout meets the given design rule. The ERC may be performed to evaluate whether there is an issue of electrical disconnection in the layout. The LVS may be performed to evaluate whether the layout is prepared to coincide with the gate-level netlist.

In step S230, an optical proximity correction (OPC) may be performed. The layout patterns obtained by the layout design process may be realized on a silicon substrate by a photolithography process. The OPC process may be performed to correct an optical proximity effect which may occur in the photolithography process. The optical proximity effect may be an unintended optical effect (such as refraction or diffraction) which may occur in the photolithography process. For example, a distortion phenomenon of layout patterns, which may be caused by the optical proximity effect, may be corrected by the OPC process. The designed shapes and positions of the designed layout patterns may be slightly changed or biased by the OPC process. The OPC process according to an embodiment of the present disclosure will be described below in more detail.

In step S240, a photomask may be manufactured based on the layout modified by the OPC process. For example, the photomask may be manufactured by patterning a chromium layer provided on a glass substrate, using the layout pattern data.

In step S250, a semiconductor device may be manufactured using the manufactured photomask. Various exposure processes and etching processes may be repeated in the manufacture of the semiconductor device using the photomask. By these processes, shapes of patterns obtained in the layout design process may be sequentially formed on a silicon substrate.

Figure 6:
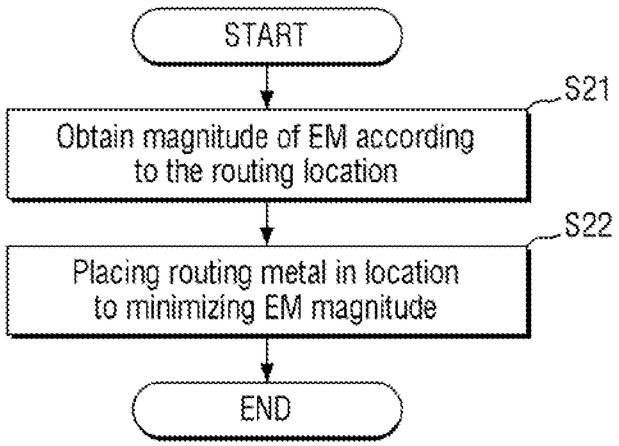
FIG. 6 is a flowchart for describing a placement and routing step of FIG. 5.

FIG. 6 is a flowchart for description the placement and routing step S220 of FIG. 5. Step S220 may include steps S21 to S22.

Referring to FIG. 6, in step S21, the magnitude of EM according to a position where the routing wire is placed may be obtained. In an embodiment of the present disclosure, the magnitude of EM allowable by each of a plurality of output pins may be pre-designated in the design rule, or may be information input from a designer. Alternatively, an allowable magnitude of EM may be calculated based on a characteristic of an IC.

For example, the magnitude of EM according to a position where the routing wire M31*a* may be obtained with reference to FIG. 1. In addition, the magnitude of EM according to a position where the routing wire M31*b* may be obtained with reference to FIG. 2.

In step S22, based on the magnitude of EM obtained in step S21, the routing wire may be placed in a location to minimize the magnitude of EM affecting the standard cell.

This way, the wiring efficiency of the standard cell may be increased. In addition, depending on EM that may be generated by the cell group connected to the routing wire, the location of the routing wire may be adjusted, so that the influence of the EM on the standard cells can be reduced.

Figure 7:
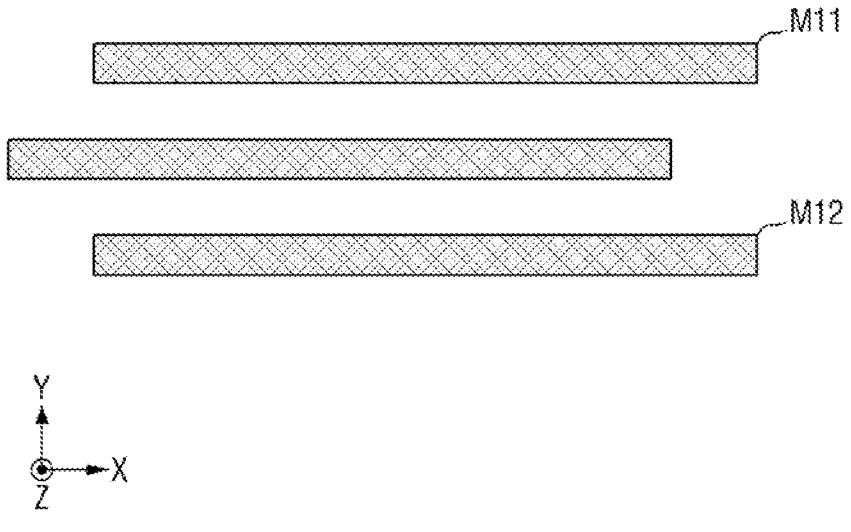
FIGS. 7 and 8 are views illustrating intermediate process steps of a method of manufacturing a standard cell according to some embodiments of the present disclosure.
Figure 8:
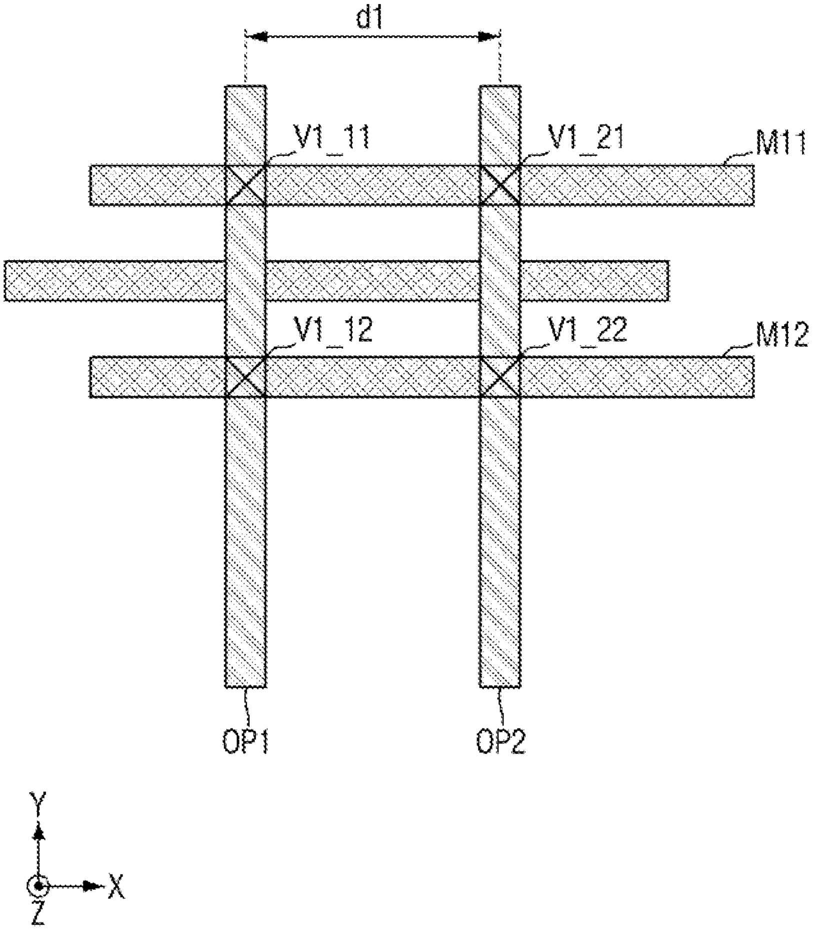

FIGS. 7 and 8 are views illustrating intermediate process steps of a method of manufacturing a standard cell according to some embodiments of the present disclosure. Although the process of manufacturing the standard cell C1 of FIG. 1 is described as an example in FIGS. 7 and 8, it should be noted that the same description is also applicable to a method of manufacturing other standard cells (e.g., C2 and C3).

Referring to FIG. 7, first, a plurality of patterns M11 and M12 may be formed along the first wiring layer M1 in the first direction X.

Thereafter, referring to FIG. 8, the first output pin OP1 and the second output pin OP2 may be provided along the second wiring layer M2 in the second direction Y that intersects the first direction X.

Then, the routing wire M31 may be placed along the third wiring layer M3 to generate the standard cell C1 of FIG. 1.

In other words, the routing wire M31 is disposed in the higher-level process than the transistor level design process, without being placed in the transistor level design step, so that the wiring efficiency of the standard cell may be increased. In addition, on the basis of EM generated by the cell group connected to the routing wire, the location of the routing wire may be adjusted, so that the influence of the EM on the standard cells can be reduced.

Figure 9:
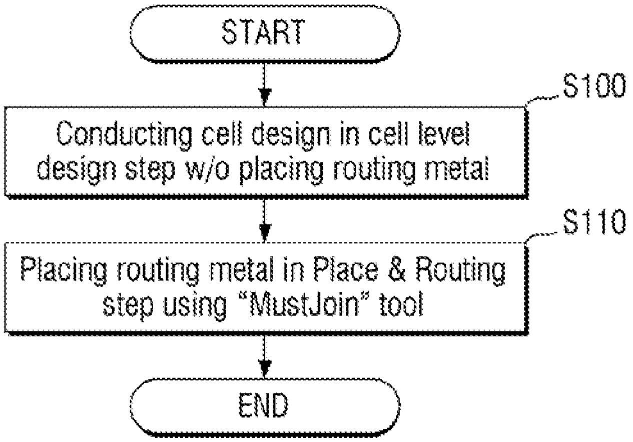
FIG. 9 is a flowchart illustrating an integrated circuit (IC) manufacturing method for manufacturing a standard cell according to some embodiments of the present disclosure.

FIG. 9 is a flowchart illustrating an IC manufacturing method for manufacturing a standard cell according to some embodiments of the present disclosure.

Referring to FIG. 9, a cell design is conducted through a transistor or cell level design without routing wires (S100). In other words, in step S100, cell design is performed without placing routing metal.

Thereafter, routing wires are placed by setting must-join pins to be output pins by means of a tool performing a placement and routing operation (S110).

In other words, the routing wire M31 is disposed in the higher-level process than the transistor level design process, without being placed in the transistor level design step, so that the wiring efficiency of the standard cell may be increased. In addition, on the basis of EM generated by the cell group connected to the routing wire, the location of the routing wire may be adjusted, so that the influence of the EM on the standard cells can be reduced.

Figure 10:
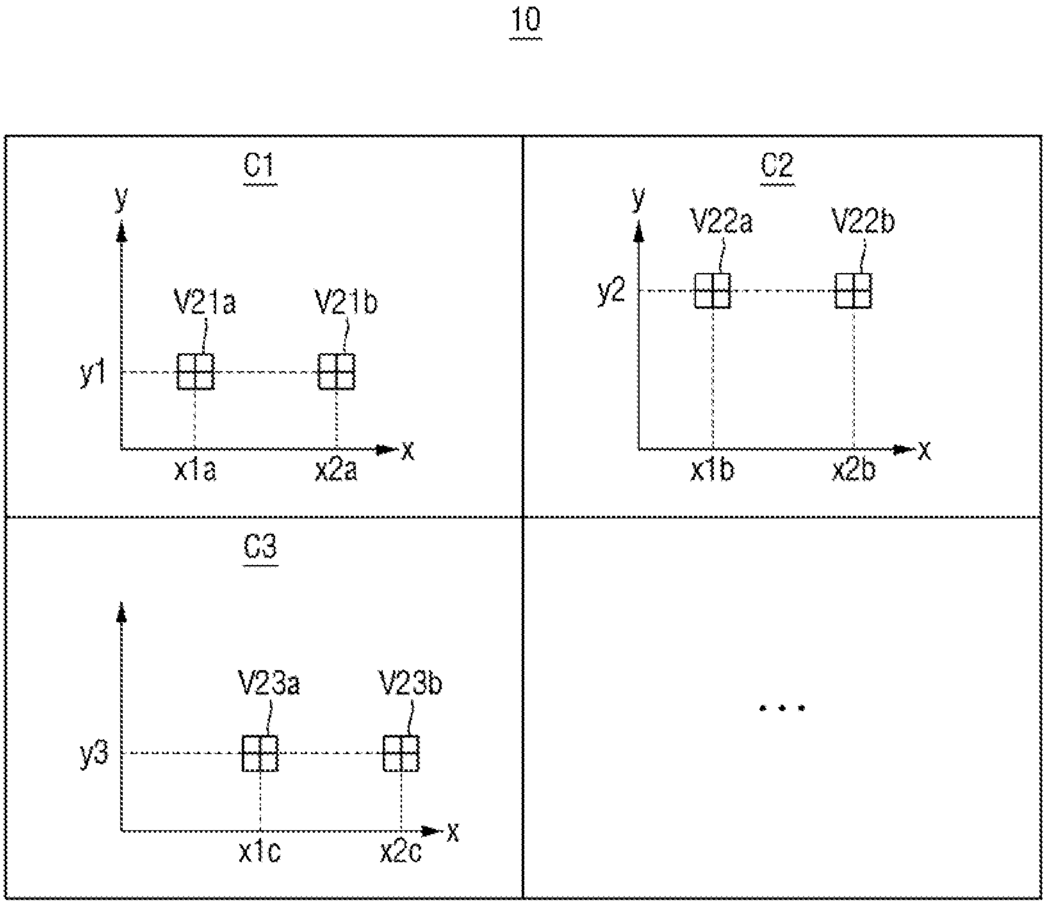
FIG. 10 is a diagram for describing an IC including standard cells according to some embodiments of the present disclosure.

FIG. 10 is a diagram for describing an IC including standard cells according to some embodiments of the present disclosure.

Referring to FIG. 10, an IC including standard cells (e.g., C1 to C3) according to some embodiments of the present disclosure is illustrated.

Vias of each of the standard cells (e.g., C1 to C3), for example, vias V21*a* and V21*b* of a first standard cell C1, vias V22*a* and V22*b* of a second standard cell C2, and vias V23*a* and V23*b* of a third standard cell C3, may be disposed in the displacement and routing step, and their arrangement positions in the respective standard cells may be different from each other. The present disclosure is not limited thereto. For example, the positions of the vias (e.g., V21*a* and V21*b* and V22*a* and V22*b*) of some standard cells (e.g., C1 and C2 among a plurality of standard cells) may be the same as each other.

More specifically, for example, the via V21*a* of the standard cell C1 may be placed at a first-a position (x1*a*, y1) in the standard cell C1. In addition, the via V21*b* of the standard cell C1 may be placed at a second-a position (x2*a*, y1) in the standard cell C1.

In addition, the via V22*a* of the standard cell C2 may be placed at a first-b position (x1*b*, y2) in the standard cell C2. In addition, the via V22*b* of the standard cell C2 may be placed at a second-b position (x2*b*, y2) in the standard cell C2.

In addition, the via V23*a* of the standard cell C3 may be placed at a first-c position (x1*c*, y3) in the standard cell C3. In addition, the via V23*b* of the standard cell C3 may be placed at a second-c position (x2*c*, y3) in the standard cell C3.

The first-a position (x1*a*, y1), the second-a position (x2*a*, y1), the first-b position (x1*b*, y2), the second-b position (x2*b*, y2), the first-c position (x1*c*, y3), and the second-c position (x2*c*, y3) may be all different from one another. Alternatively, positions of some of the pairs of vias in the plurality of standard cells may be the same as each other. However, in the IC 10 including the standard cells according to some embodiments of the present disclosure, positions of pairs of vias placed in at least two standard cells are different from each other.

Although embodiments of the present disclosure have been described above with reference to the accompanying drawings, it will be understood by those of ordinary skill in the art that the present disclosure is not limited thereto and may be implemented in many different forms without departing from the technical idea or features thereof. Therefore, it should be understood that the embodiments set forth herein are merely examples and are not restrictive.

What is claimed:

1. An integrated circuit, comprising:

a first standard cell including a first-a output pin and a second-a output pin, a first routing wire configured to electrically connect the first-a output pin to the second-a output pin, a first-a via configured to electrically connect the first-a output pin to the first routing wire, and a second-a via configured to electrically connect the second-a output pin to the first routing wire, wherein each of the first-a output pin and the second-a output pin are configured to output a first signal; and a second standard cell including a first-b output pin and a second-b output pin, a second routing wire configured to electrically connect the first-b output pin to the second-b output pin, a first-b via configured to electrically connect the first-b output pin to the second routing wire, and a second-b via configured to electrically connect the second-b output pin to the second routing wire, wherein each of the first-b output pin and the second-b output pin are configured to output a second signal, wherein the first-a via is placed at a first-a position in the first standard cell, the second-a via is placed at a second-a position in the first standard cell, the first-b via is placed at a first-b position in the second standard cell, the second-b via is placed at a second-b position in the second standard cell, and the first-a position, the second-a position, the first-b position, and the second-b position are different from one another, and wherein the first-a position and the second-a position are determined based on electro-migration (EM) of first load cells to be connected to the first routing wire.

2. The integrated circuit of claim 1, further comprising:

a third standard cell including a first-c output pin and a second-c output pin, a third routing wire configured to electrically connect the first-c output pin to the second-c output pin, a first-c via configured to electrically connect the first-c output pin to the third routing wire, and a second-c via configured to electrically connect the second-c output pin to the third routing wire, wherein each of the first-c output pin and the second-c output pin are configured to output a third signal, wherein the first-c via is placed at a first-c position in the third standard cell, the second-c via is placed at a second-c position in the third standard cell, and the first-c position and the second-c position are different from each other.

3. The integrated circuit of claim 1, wherein the first-b position and the second-b position is determined based on EM of second load cells to be connected to the second routing wire.

4. The integrated circuit of claim 1, wherein the first routing wire is placed by setting must-join pins of a placement and routing (P&R) tool to be the first-a output pin and the second-a output pin and the second routing wire is placed by setting must-join pins of the placement and routing tool to be the first-b output pin and the second-b output pin.

* * * * *